United States Patent
Domenicucci et al.

(10) Patent No.: US 6,387,790 B1
(45) Date of Patent: May 14, 2002

(54) CONVERSION OF AMORPHOUS LAYER PRODUCED DURING IMP TI DEPOSITION

(75) Inventors: Anthony Gene Domenicucci, New Paltz; Chung-Ping Eng, Hopewell Junction, both of NY (US); William Joseph Murphy, Essex Junction, VT (US); Tina J. Wagner, Newburgh, NY (US); Yun-Yu Wang, Poughquag, NY (US); Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 09/602,228

(22) Filed: Jun. 23, 2000

(51) Int. Cl.$^7$ .................. H01L 21/3205; H01L 21/4763
(52) U.S. Cl. ................ 438/592; 438/653; 438/654; 438/655; 438/656; 438/660; 438/682
(58) Field of Search .................. 438/587–689

(56) References Cited

U.S. PATENT DOCUMENTS

| 5,192,708 A | 3/1993 | Beyer et al. |
|---|---|---|
| 5,643,823 A | 7/1997 | Ho et al. |
| 5,747,866 A | 5/1998 | Ho et al. |
| 5,754,390 A | 5/1998 | Sandhu et al. |
| 5,869,389 A | 2/1999 | Ping et al. |
| 5,888,888 A | 3/1999 | Talwar et al. |
| 5,950,078 A | 9/1999 | Mackawa et al. |
| 6,303,490 B1 * | 10/2001 | Jeng .......................... 438/627 |

* cited by examiner

Primary Examiner—Richard Booth
(74) Attorney, Agent, or Firm—Scully, Scott, Murphy & Presser; Tiffany L. Townsend

(57) ABSTRACT

A method of fabricating a Ti-containing liner having good contact resistance and coverage of a contact hole is provided. The method which converts an amorphous region of ionized metal plasma deposited Ti into a substantially crystalline region includes (a) providing a structure having at least one contact hole formed therein, said at least one contact hole exposing at least a portion of a cobalt disilicide contact formed in a semiconductor substrate; (b) depositing a Ti/TiN liner in said at least one contact hole by ionized metal plasma deposition; (c) annealing said Ti/TiN liner under conditions effective to recrystallize any amorphous region formed during said annealing into a crystalline region including a TiSi$_2$ top layer and a CoSi$_x$ bottom layer; and (d) optionally forming a conductive material on said Ti/TiN liner.

19 Claims, 2 Drawing Sheets

CONVERSION OF AMORPHOUS LAYER PRODUCED DURING IMP TI DEPOSITION

FIELD OF THE INVENTION

The present invention relates to semiconductor manufacturing, and more particularly to a method of converting an amorphous region produced during the annealing of an ionized metal plasma (IMP) Ti/TiN liner into a substantially crystalline region. The substantially crystalline region and the Ti/TiN liner are used for lining a metallic silicide, such as $CoSi_2$. The present invention is also directed to an inventive crystalline-containing liner and a contact structure which includes the same.

BACKGROUND OF THE INVENTION

In the field of complementary metal oxide semiconductor (CMOS) devices, the aspect ratio of metal contacts is increasing rapidly. Robust liner processes are thus required to assure a manufacturable process. Specifically, liner materials that provide uniform and continuous coverage of high aspect ratio contact holes are required. The term "high aspect ratio" is used herein to denote a contact hole whose height (H) to width (W) ratio, H/W, is greater than 2.

One liner material that is known to provide good coverage of high aspect ratio contact holes is ionized metal plasma (IMP) deposited titanium, Ti. However, upon furnace annealing the IMP deposited Ti, an amorphous region forms between the deposited Ti liner and the metal silicide contact. The term "amorphous" is used herein to denote a region that lacks organization and unity.

When $CoSi_2$ is employed as the contact material, the amorphous region consists of Co, Si and Ti. It is known, in this regard, that Co-containing $TiSi_x$ (a titanium silicide) is usually amorphous because of the mismatch between Co and Ti atoms and that this amorphous region cannot be converted to crystalline $TiSi_x$ and $CoSi_x$ until a temperature of between 650° C.–700° C. is reached.

An amorphous region comprising $TiSi_x$ is undesirable in contact structures because the amorphous region is much more reactive than a fully converted silicide. Moreover, the $TiSi_x$ phase of titanium silicide has a much lower resistance than crystalline $TiSi_2$. The amorphous region of IMP deposited Ti is undesirable since it leaves the annealed liner marginal, i.e., the presence of a liner containing an amorphous region of IMP Ti typically results in liner failure.

There is thus a continued need in the semiconductor industry to develop new and improved methods that can solve the amorphous (Ti,Co)Si problem mentioned above.

SUMMARY OF THE INVENTION

One object of the present invention is to provide a method of fabricating a substantially crystalline-containing liner that provides good coverage (i.e., uniformity and continuity) of a high aspect ratio, H/W is greater than 2, contact hole.

Another object of the present invention is to provide a method of fabricating a substantially crystalline-containing liner that has a good contact resistance associated therewith.

A still further object of the present invention is to provide a method of converting an amorphous region formed during the annealing of ionized metal plasma deposited Ti into a substantially crystalline region. The term "substantially crystalline" is used herein to denote a region that has high-organization and unity.

An even further object of the present invention is to provide a substantially crystalline-containing liner that is more reliable against fluoride attack in a later $WF_6$ deposition processing step.

A yet further object of the present invention is to provide a Ti/TiN liner that is not prone to cause liner failure.

These and other objects and advantages are achieved in the present invention by utilizing a 'rapid thermal liner anneal' (RTLA) process in which higher temperatures and shorter anneal times are employed in converting the amorphous IMP Ti region into a substantially crystalline region.

In prior art processes, annealing is typically conducted in a furnace at temperatures less than 600° C. using a forming gas such as $N_2/H_2$. In this application, the IMP deposited Ti liner material is annealed at temperatures greater than 600° C. for shorter durations than a typical furnace anneal. This RTLA step converts the amorphous region of IMP deposited Ti into a substantially crystalline region.

Specifically, in one embodiment of the present invention, the method of the present invention comprises the steps of:
(a) providing a structure having at least one contact hole formed therein, said at least one contact hole exposing at least a portion of a cobalt disilicide contact formed in a semiconductor substrate;
(b) depositing a Ti/TiN liner in said at least one contact hole by ionized metal plasma deposition; and
(c) annealing said Ti/TiN liner under conditions effective to recrystallize any amorphous region formed during said annealing into a crystalline region, said crystalline region including a $TiSi_2$ top layer and a $CoSi_x$ bottom layer.

The present invention also may include the step of: (d) forming a conductive material on said Ti/TiN liner.

In another embodiment wherein the cobalt disilicide is in contact with a polysilicon gate, the method of the present invention comprises the steps of:
(a) forming a cobalt disilicide layer on a substrate e.g., polysilicon;
(b) forming a Ti/TiN liner on said cobalt disilicide; and
(c) annealing said Ti/TiN liner under conditions effective to recrystallize any amorphous region formed during said annealing into a crystalline region.

Another aspect of the present invention relates to a semiconductor contact structure that is formed utilizing the inventive RLTA processing step of the present invention. Specifically, the contact structure of the present invention comprises:
a semiconductor substrate having a cobalt disilicide contact formed therein;
a patterned pad nitride layer on said substrate, said patterned pad nitride layer not covering said cobalt disilicide contact;
a patterned dielectric layer on said patterned pad nitride layer;
a contact hole formed in said patterned pad nitride and dielectric layers exposing said cobalt disilicide contact;
a Ti/TiN liner formed in said contact hole; and
a conductive material formed on said Ti/TiN liner in said contact hole, wherein crystallized regions of $CoSi_x$ and $TiSi_2$ are between said Ti/TiN liner and said cobalt disilicide contact.

A further aspect of the present invention relates to a liner material which comprises Ti/TiN and underlying crystalline layers of $TiSi_2$ and $CoSi_x$.

DETAILED DESCRIPTION OF THE INVENTION

The present invention which provides a method of converting an amorphous region of ionized metal plasma deposited Ti into a substantially crystalline region will now be described in more detail by referring to FIGS. 1–4 of the present invention.

Figure 1:
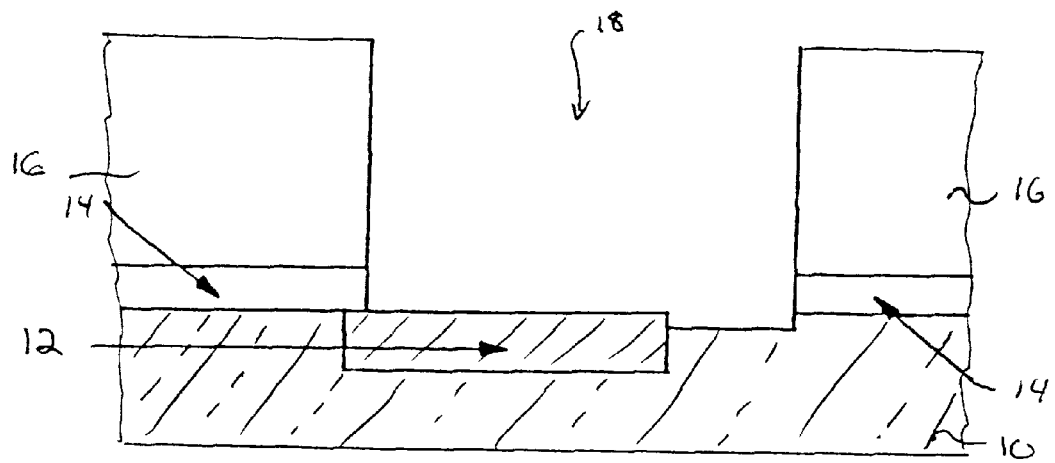
FIGS. 1–4 show the basic processing steps of the present invention in which the amorphous region of IMP deposited Ti is converted into a substantially crystalline region.

Reference is first made to FIG. 1 which shows the initial structure that is employed in one of the embodiments of the present invention. Specifically, the initial structure shown in FIG. 1 comprises semiconductor substrate 10 having $CoSi_2$ contact region 12 formed therein. The structure shown in FIG. 1 also includes patterned pad nitride layer 14 formed on substrate 10, patterned dielectric layer 16 formed on pad nitride layer 14, and contact hole 18 formed through the pad nitride and dielectric layers. The contact hole may extend into part of substrate 10 as shown in FIG. 1.

It is noted that although the drawings of the present invention show the presence of only one contact region and one contact hole, a plurality of such contact regions and contact holes may be formed in the structure. The number of contact regions and contact holes present in the structure does not limit the applicability of the inventive method.

The structure shown in FIG. 1 is fabricated using processing techniques that are well known to those skilled in the art. Likewise, the initial structure shown in FIG. 1 is composed of conventional materials that are well known to those skilled in the art.

For example, semiconductor substrate 10 is composed of any Si-containing semiconductor material such as, but not limited to: Si, SiGe, Si/SiGe, $Si/SiO_2/Si$, SOI, (silicon-on-insulator) and other like Si-containing semiconductor materials. The substrate may be of the n or p-type depending on the desired device to be fabricated. Moreover, the substrate make contain various isolation and/or device regions either formed in the substrate or on a surface thereof. For clarity, these regions are not shown in the drawings, but are nevertheless meant to be included in substrate 10.

$CoSi_2$ contact 12 is formed in substrate 10 by utilizing a conventional salicide process in which a layer of Co is first formed on the surface of the substrate, the layer is then patterned, and thereafter a conventional silicide annealing process is performed to provide the $CoSi_2$ contact. Following annealing, any unreacted Co is removed from the structure utilizing a conventional wet chemical etch process.

Pad nitride layer 14 is formed on the substrate utilizing a conventional deposition process such as chemical vapor deposition (CVD), plasma-assisted CVD, spin-on coating, evaporation and other like deposition processes. Conventional nitride-containing materials such as $Si_3N_4$ and TiN are used in forming the pad nitride layer. The thickness of the pad nitride layer is not critical to the present invention, but generally the pad nitride layer has a thickness of from about 400 to about 700 Å.

Dielectric layer 16 is formed on the pad nitride layer utilizing any of the above-mentioned deposition processes used in forming the pad nitride layer. A preferred means of forming the dielectric layer is by sub-atmospheric CVD of boron phosphorus silicate glass (BPSG). The dielectric layer employed in the present invention may comprise any organic or inorganic dielectric material well known to those skilled in the art.

For example, when an organic dielectric layer is employed, the dielectric layer may be composed of a polyimide, a Si-containing polymer, a fluoropolymer, a hydrocarbon-polymer, a parylene polymer and other like organic-containing dielectrics.

Examples of suitable inorganic dielectrics that may be employed in the present invention as dielectric layer 16 include, but are not limited to: $SiO_2$, $Al_2O_3$, $Ta_2O_5$, doped silicate glasses such as arsenic silicate glass (ASG), BPSG, and phosphorus silicate glass (PSG), perovskite-type oxides such as barium strontium titanate, and other like inorganic-containing dielectrics.

It is noted that the dielectric layer may be composed of one dielectric material or a plurality of dielectric materials may be used. The thickness of the dielectric layer is not critical to the present invention, but typically, the dielectric layer employed in the present invention has a thickness of from about 4000 to about 6000 Å.

Contact hole 18 is formed in the structure stopping on contact region 12 by utilizing a conventional lithography process (including apply a photoresist, patterning said photoresist and developing the pattern) and an etching process. The etching process includes the use of a conventional dry etch process such as reactive-ion etching, ion-beam etching and plasma etching. A preferred means of etching the contact hole is by utilizing a high density plasma etch process. After etching, the photoresist used in producing contact hole 18 is removed from the structure utilizing a conventional stripping process that is well known to those skilled in the art providing the structure shown in FIG. 1.

In a preferred embodiment of the present invention, the contact hole provided above has a high aspect ratio associated therewith. As stated previously herein, the term "high aspect ratio" refers to a contact hole wherein the hole's height, H, to width, W, ratio is greater than 2.

Figure 2:
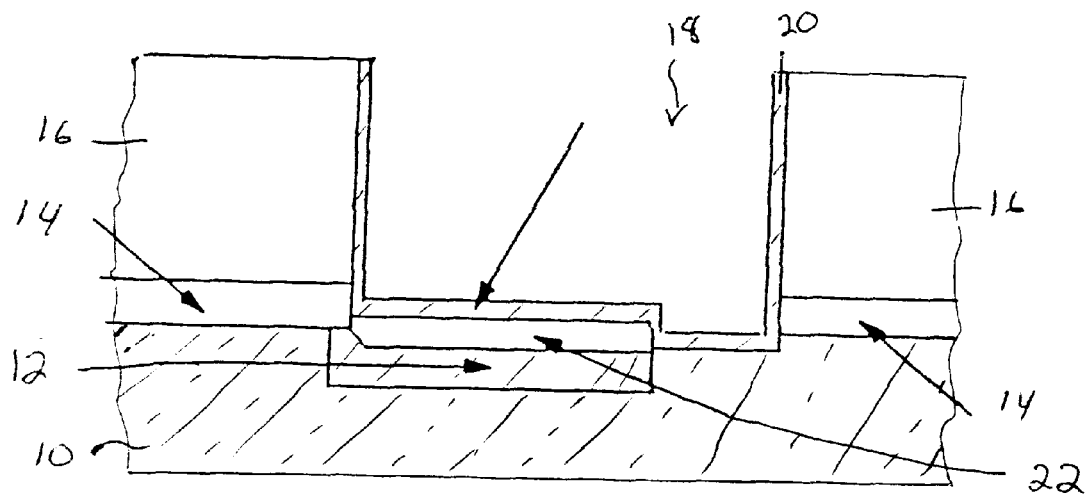
Figure 3:
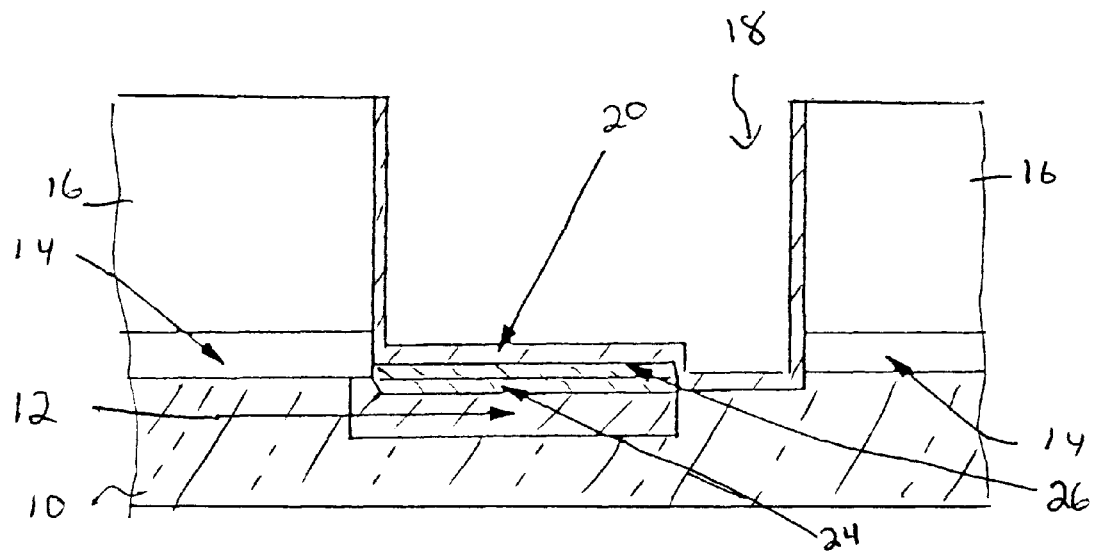
Figure 4:
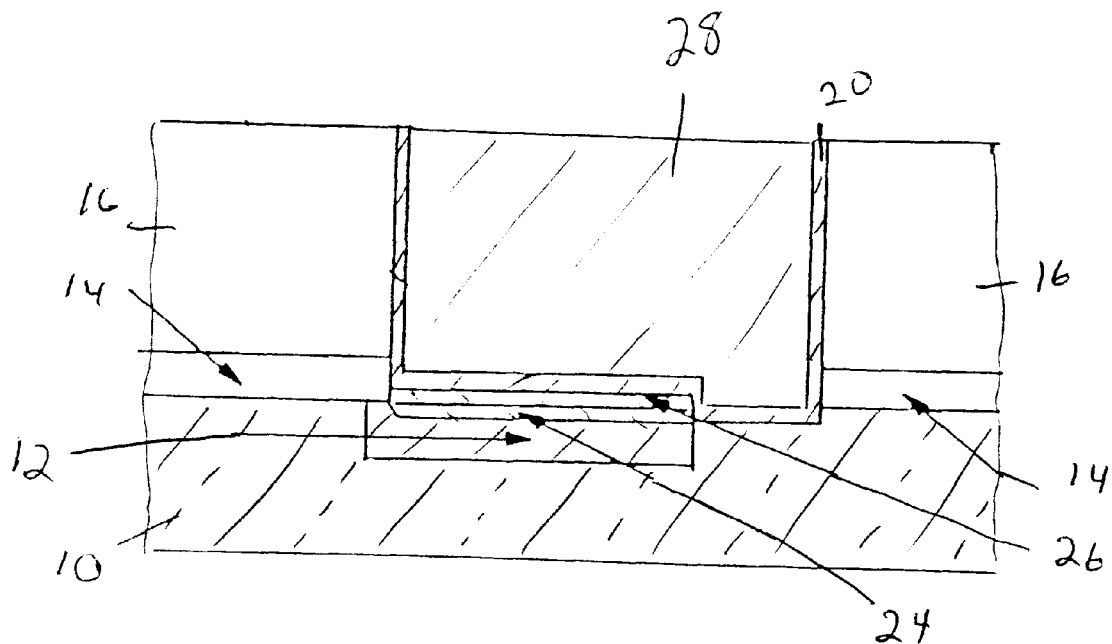

FIG. 2 illustrates the next step of the present invention wherein Ti/TiN liner 20 is deposited in contact hole 18 so as to line the sidewalls and the bottom portion of the contact hole. The Ti/TiN liner is formed utilizing a conventional ionized metal plasma (IMP) deposition process wherein the Ti layer is formed by sputtering Ti in the presence of Ar and the TiN layer is formed by sputtering TiN in the presence of $N_2$ and Ar.

The IMP Ti/TiN process is typically carried out utilizing the following conditions:

Temperature: 200° C.

DC Power: 2 kW

Rf power: 2.5 kW

Ar flow for Ti formation: 64 sccm

Ar and $N_2$ flow for TiN formation: 44 sccm and 18 sccm, respectively.

It is noted that other IMP deposition conditions besides those mentioned above can also be employed in the present invention as long as the conditions used are capable of forming a continuous and uniform Ti/TiN liner in the contact hole.

The thickness of the Ti/TiN liner may vary depending upon the exact IMP deposition conditions used, but typically the thickness of Ti/TiN liner 20 is from about 250 to about 350 Å, with a thickness of about 300 Å being more preferred.

FIG. 2 shows the presence of amorphous region 22 that is formed between the Ti/TiN liner and the contact region using forming gas annealing temperatures below 600° C. This amorphous region is comprised of (Ti,Co)Si. The amorphous region is undesirable in the structure shown in the present invention since is exhibits the drawbacks mentioned supra. Specifically, liners which include the presence of an amorphous region of IMP Ti are typically prone to failure. By converting the amorphous region to a crystalline region, liner failure is substantially reduced.

To recrystallize the amorphous region into a crystalline region including a top layer comprised of $TiSi_2$ (denoted as reference numeral 26 in FIG. 3) and a bottom layer comprised of $CoSi_x$ (denote as reference numeral 24 in FIG. 3) applicants have developed a RTLA process in which the annealing is carried out at higher temperatures and shorter times than conventional forming gas anneals.

Specifically, the annealing step employed in the present invention to recrystallize the amorphous region into crystalline regions 26 and 24 is a rapid thermal annealing process. The rapid thermal annealing process employed in the present invention is carried out at a temperature of from about 600° to about 750° C., with a temperature of from about 650° to about 700° C. being more highly preferred. The rapid thermal annealing process is carried out at a single temperature or various ramp and soak cycles can also be employed.

The duration of the rapid thermal anneal process of the present invention is from about 30 to about 120 seconds, with a duration of about 60 seconds being more highly preferred. The rapid thermal annealing process used in the present invention is carried out in a reducing atmosphere such as $N_2/H_2$, $NH_3$ and other like reducing atmospheres that are capable of recrystallizing the amorphous IMP Ti region into a crystalline region.

A conductive material 28 may then deposited into the contact hole on Ti/TiN liner 20 utilizing any conventional deposition process such as CVD, plasma-assisted CVD, evaporation, sputtering, plating, chemical solution deposition and other like deposition processes. The conductive material is comprised of any conductive metal such as W, Cu, Cr, Al, Ag, Pt, Ir, Ru and alloys or oxides thereof. A preferred conductive material employed in the present invention is CVD deposited W which may be deposited by a $WF_6$ or $W(Co)_6$ precursor.

It should be emphasized that the amorphous $TiSi_x$ region formed during prior art annealing of IMP deposited Ti is highly reactive, therefore, structures containing the same are unreliable. On the other hand, the $TiSi_2$ crystalline layer produced in the present invention by the RTLA step is more stable and more reliable than the amorphous $TiSi_x$ layer.

Following deposition, the structure may be planarized utilizing a conventional planarization process such as chemical-mechanical polishing (CMP) and grinding. Also, other conventional CMOS processing steps used in making other device regions are also contemplated herein.

In addition to the structure shown in the drawings of the present invention, the inventive RTLA processing step works in other semiconductor structures in which a liner of Ti/TiN can be used. For example, the inventive RTLA processing step would work for providing a substantially crystalline liner of Ti/TiN in a structure in which cobalt disilicide is in contact with a polysilicon gate. In accordance with such an embodiment, a polysilicon gate would be formed on (or within) a semiconductor substrate using conventional methods well known in the art, a cobalt disilicide layer, as described above, would then be formed on the polysilicon gate, a Ti/TiN liner would be formed by IMP deposition, and thereafter the RTLA processing step of the present invention would be conducted to convert the amorphous region of IMP Ti to a crystalline region. This embodiment of the present invention is not specifically illustrated herein.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of fabricating a substantially crystalline liner having good contact resistance and coverage of a contact hole comprising the steps of:

(a) providing a structure having at least one contact hole formed therein, said at least one contact hole exposing at least a portion of a cobalt disilicide contact formed in a semiconductor substrate;

(b) depositing a Ti/TiN liner in said at least one contact hole by ionized metal plasma deposition; and (c) annealing said Ti/TiN liner under conditions effective to recrystallize any amorphous region formed into a crystalline region.

2. The method of claim 1 wherein said crystalline region comprises a $TiSi_2$ top layer and a $CoSi_x$ bottom layer.

3. The method of claim 1 further comprising (d) forming a conductive material on said Ti/TiN liner.

4. The method of claim 1 wherein said contact hole is formed in a pad nitride layer and a dielectric layer, said pad nitride layer being formed on said substrate and said dielectric being formed on said pad nitride layer.

5. The method of claim 1 wherein said contact hole is formed by lithography and etching.

6. The method of claim 5 wherein said lithography includes applying a photoresist to said dielectric layer, patterning the photoresist and developing the pattern.

7. The method of claim 5 wherein said etching includes reactive-ion etching (RIE), ion-beam etching or plasma etching.

8. The method of claim 5 wherein said etching is a high density plasma etching process.

9. The method of claim 1 wherein said contact hole is a high aspect ratio contact hole whose height to width ratio is greater than 2.

10. The method of claim 1 wherein said cobalt disilicide contact is formed by a salicide process.

11. The method of claim 1 wherein said IMP deposition process includes sputtering Ti in the presence of Ar and sputtering TiN in the presence of $N_2$ and Ar.

12. The method of claim 1 wherein said annealing is a rapid thermal annealing process that is carried out at a temperature of from about 600° to about 750° C. for a time period of from about 30 to about 120 seconds.

13. The method of claim 12 wherein said rapid thermal annealing is carried out at a temperature of from about 650° to about 700° C. for a time period of about 60 seconds.

14. The method of claim 12 wherein said rapid thermal annealing is carried out in a reducing atmosphere.

15. The method of claim 14 wherein said reducing atmosphere is $N_2/H_2$ or $NH_3$.

16. The method of claim 3 wherein step (d) is carried out by CVD, plasma-assisted CVD, evaporation, sputtering, plating or chemical solution deposition.

17. The method of claim 3 further comprising (e) planarizing the structure.

18. A method of converting an amorphous region of ionized metal plasma deposited Ti into a substantially crystalline region by annealing comprising:

(a) forming a cobalt disilicide layer on a substrate;

(b) forming a Ti/TiN liner on said cobalt disilicide layer; and (c) annealing said Ti/TiN liner under conditions effective to recrystallize any amorphous region formed into a crystalline region.

19. The method of claim 18 wherein said substrate is a polysilicon gate.

* * * * *